United States Patent
Cauchy

[19]

[11] Patent Number: 5,889,787
[45] Date of Patent: Mar. 30, 1999

[54] CIRCUIT INCLUDING STRUCTURAL TESTING MEANS WITH NO DEDICATED TEST PAD FOR TESTING

[75] Inventor: Xavier Cauchy, Grenoble, France

[73] Assignee: SGS-Thomson Microelectronics S.A., Saint Genis, France

[21] Appl. No.: 922,611

[22] Filed: Sep. 3, 1997

[30] Foreign Application Priority Data

Sep. 10, 1996 [FR] France .................................. 96 11228

[51] Int. Cl.⁶ .................................................. G01R 31/28
[52] U.S. Cl. .......................................... 371/22.5; 324/263
[58] Field of Search ................................. 371/22.5, 22.6, 371/22.31, 22.1; 324/763, 765; 395/183.06

[56] References Cited

U.S. PATENT DOCUMENTS

| | | | |
|---|---|---|---|
| 5,127,011 | 6/1992 | Combs et al. ........................... | 371/27 |
| 5,311,520 | 5/1994 | Raghavachari ........................ | 371/21.6 |
| 5,404,358 | 4/1995 | Russell ................................... | 371/22.3 |
| 5,553,082 | 9/1996 | Connor et al. ......................... | 371/25.1 |
| 5,642,057 | 6/1997 | Oke et al. .............................. | 324/763 |
| 5,644,580 | 7/1997 | Champlin .............................. | 371/22.5 |
| 5,724,502 | 3/1998 | Cherichetti et al. ............... | 395/183.04 |

*Primary Examiner*—Hoa T. Nguyen
*Attorney, Agent, or Firm*—Wolf, Greenfield & Sacks, P.C.

[57] ABSTRACT

The present invention provides a circuit capable of operating according to a normal operating mode or to a structural operating mode. The test mode is stored in an internal flip-flop via an interface of the circuit. In test mode, the flip-flop is insulated from the interface by multiplexing means. To exit the test mode, an input temporarily dedicated to this function is used, this input being then insulated by multiplexing means from the rest of the circuit.

24 Claims, 1 Drawing Sheet

CIRCUIT INCLUDING STRUCTURAL TESTING MEANS WITH NO DEDICATED TEST PAD FOR TESTING

BACKGROUND OF THE INVENTION

1. Field of the Invention

The present invention relates to structural testing of logic integrated circuits, or integrated circuits including logic portions.

2. Discussion of the Related Art

The production of integrated circuits generally includes steps of testing of the produced circuits, once manufactured. These tests are usually of two sorts: structural tests on the one hand, and functional tests on the other hand. Structural tests consist of checking that the circuits do not have physical defects which make them inoperative. Such defects are independent from the applications of the circuits. The functional tests consist of checking, for circuits showing no physical defects, that these circuits operate properly for the applications for which they are meant.

In logic circuits, the effect of physical defects is shown by a fault model on a logic level. The most widely used model is the so-called stuck-at-fault model, in which an electric node of the circuit always keeps the same logic level (in binary logic: the low state for a stuck-at fault at 0 and the high state for a stuck-at fault at 1), independently from the states of the logic signals which control the node. If a two-input AND-type logic gate having an input blocked in the low state (stuck-at fault at 0) is for example considered, the signal provided by the gate will always be in the low state whatever the state of the signal received by the other input.

In order to detect a fault on a node, the node has to be controllable and observable. Ideally, all the nodes of a logic circuit to be tested must be controllable and observable.

The controllability is the ability to impose on each internal node of the logic circuit a given logic state, based on the logic state of the primary inputs/outputs of the circuit. The "primary inputs/outputs of the circuit" refer to the nodes of the circuit which are accessible from the outside of the circuit, that is, directly connected to access pads. The state of these nodes may be controlled (that is, imposed and/or observed) directly by a testing device.

The observability is the ability to propagate the logic states of the internal nodes to pins of the circuit, which renders possible an a posteriori analysis of the circuit structure.

Conventionally, the logic circuits are submitted o)testing patterns. A pattern corresponds to a set of logic states applied to the primary inputs of the circuit, and to a set of logic states supplied by the primary inputs as a response to the states received by the circuit. For a given circuit, the states supplied by the circuit are compared to the expected states, these expected states being calculated based on the logic equations of the circuit and based on all the states supplied to the circuit. There is success if the states supplied by the circuit coincide with the expected states. Any difference indicates that there is a defect in the fabrication of the circuit.

Considering the stuck-at-fault pattern, a test pattern must enable detection of as many stuck-at faults as possible, if present. For this purpose, it is attempted to put on each controllable node of the circuit a logic value and whether the forced value has effectively been taken into account is checked. For example, if a node is blocked in the low state, it requires, to be detected, a pattern which would force it to the high state if it was not blocked. Finally, the test pattern must propagate the effect of the fault to an output where the consequence can be observed (either directly, if the node is accessible, or indirectly if a node placed downstream of the failing node is observed).

For small combinatory circuits, test patterns with a 100% fault coverage (all possible faults are detectable) are relatively easy to develop, even once the circuit is manufactured.

Conversely, the testing of a large sequential circuit is more complicated and may require the application of a complex set of patterns arranged in a specific order. To simplify testing, the implementation of structural tests from as soon as the steps of designing of the circuit structure tend to be taken into account, for example by inserting internal circuits dedicated to the testing in the circuits.

A conventional solution is to insert one or several test shift registers, which generally enables an excellent fault coverage. This (these) test register(s) are formed of flip-flops connected in series to one another, these flip-flops being positioned at the nodes to be tested so as to impose and/or sample the logic states of these nodes.

Flip-flops specifically dedicated to testing may also be used.

Flip-flops used in normal operating mode and in test mode may also be used. This case is illustrated in FIG. 1. In this last case, multiplexing circuits are typically placed at the inputs of these flip-flops in order to selectively connect their input according to the selected mode, that is, according to whether the input must be connected to the output of a flip-flop in test mode, or to another node in normal operating mode. Thus, in FIG. 1, a D flip-flop referenced as BD1 has an input D, an output Q, and two control inputs C1 and C2 for receiving a signal SET for setting to the high state and a signal CLEAR for setting to the low state. Input D is connected to the output of a two-input multiplexer MB1. The inputs of multiplexer MB are connected to two nodes NA and NB. A selection signal S enables to connect the input D of the flip-flop either to node NA or to node NB. Node NA corresponds for example to an output of a circuit LBD of combinatory gates. Node NB corresponds for example to an output of a flip-flop BD2 which can be dedicated to the testing or have, like flip-flop BD1, a input multiplexer. Output Q of flip-flop BD1 is connected to an input of a circuit LBQ of combinatory gates and to an input of a flip-flop BD3 via a multiplexer MB3. In test mode, the input D of flip-flop BD1 is connected to node NB and its output Q is connected to the input of flip-flop BD3. In normal operating mode, input D is connected to node NA.

A test sequence can be broken up into four steps:

1—in test mode, by a series of shiftings in the flip-flops forming the test register(s), the states to be imposed are brought to the desired nodes. The circuit is then inoperative.

2—the circuit is set back to the normal operating mode. The imposed states combine to create states which are functions of the structure and of the failure or success of the logic elements of the circuit.

3—all the resulting states or part of them are sampled in the testing flip-flops.

4—the sampled values are extracted from the circuit by shiftings in these flip-flops, to be analyzed.

A problem set by the testing systems used especially is the impact of such systems on the price of the circuits, even when they are only briefly used at the beginning of the lifetime of the circuits.

The primary inputs/outputs available for the testing on a circuit are generally a rare resource, especially for circuits including few primary inputs/outputs. This problem is all the more constraining as the circuits are encapsulated in housings having a standardized number of pins. Changing the number of pins may cause a significant variation of the housing surface, and thus of the price of the circuits. Sometimes, the suppression of a single input/output may enable use of a smaller housing (it will for example be passed from 12 pins to 8 pins) and thus to decrease in a non negligible proportion the price of the circuit.

To be able to do without inputs/outputs exclusively dedicated to testing thus appears to be very advantageous.

A solution is to test the circuits only under their functional aspect, that is, practically, to use the circuit in normal operating mode in the application for which it is meant. This solution has the disadvantage of requiring a lot of time and energy to devise stimuli which ensure a satisfactory fault coverage, especially for complex circuits.

Another, widely employed, solution, is to multiplex most of the primary test inputs/outputs with functional pins, that is, a same input/output receives or provides a signal to internal elements which can be different in normal operating mode and in test mode. A single pin of the circuit is dedicated to testing to provide the signal which controls the multiplexing.

A solution for suppressing or eliminating this dedicated pin is to replace it with a programming bit representative of the mode, that is, by a flip-flop of an internal control register, programmable from the outside via an interface formed of data, address and control buses only.

This solution, of software type, has several disadvantages:
- it must be guaranteed that the content of the flip-flop will not be modified upon loading by shifting of the testing flip-flops, in which case this loading would be blocked as soon as the value of the programming bit would correspond to the functional mode. The flip-flop must thus be placed outside the shifting paths used for testing,
- it must be guaranteed that the content of the flip-flop will not be modified untimely during the testing steps performed in functional mode,
- an access to the flip-flop must be guaranteed to be able to modify its content, when the mode employed is desired to be modified from the outside.

A solution to overcome these disadvantages is to insulate the interface of the circuit to be tested which is implemented to access the flip-flop. This runs the risks of a non-negligible decrease in the fault coverage because the circuit nodes connected to this interface are no longer being tested.

SUMMARY OF THE INVENTION

Given the above, an aim of the present invention is to provide a software-type solution enabling suppression or elimination of any input exclusively dedicated to the control of the operating mode, without decreasing the fault coverage, and while ensuring the possibility of controlling the operation of the circuits from the outside.

For this and other purposes, the invention provides:
- to insulate, when entering the test mode, a first pad from the internal elements to which it is connected in normal operating mode, these elements being connected to a second pad substituting for the first pad, and
- to control the exit from the test mode by this first pad, the register storing the mode implemented being on the one hand responsive to the state present thereon, and on the other hand insulated from the interface in test mode.

The primary input corresponding to the first pad will for example be the reset control input generally present in logic circuits or circuits including logic parts. The present invention enables use of this input to temporarily control the exit from the test mode, without resulting in a decrease of the fault coverage.

Accordingly, the present invention provides a circuit capable of operating according to at least a first and a second operating mode, including means of interface with the outside, a storage cell programmable via the interface means of the circuit, the content of the cell being representative of the operating mode of the circuit, a first input connected on the one hand to the cell to be able to modify its content in order to modify the mode, and on the other hand to at least one element of the circuit, a second input, and multiplexing means controlled by the cell for, on the one hand, selectively connecting the at least one element to the second input when the circuit is in the first mode and to the first input in the second mode, and on the other hand, insulating the cell from the interface means when the circuit is in the first mode.

BRIEF DESCRIPTION OF THE DRAWINGS

Other advantages and characteristics of the present invention will appear from the following non-limiting description of examples of implementation of the present invention, taken in conjunction with the accompanying drawings, in which.

DETAILED DESCRIPTION

Figure 1:
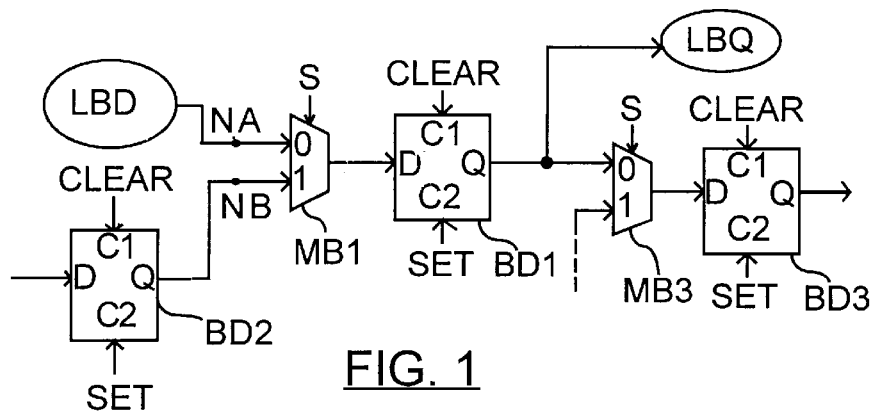
FIG. 1 illustrates an example of circuit using flip-flops used in a normal operating mode and in a shift test mode, FIG. 2 schematically illustrates a circuit including shift testing means and a test control pin.
Figure 2:
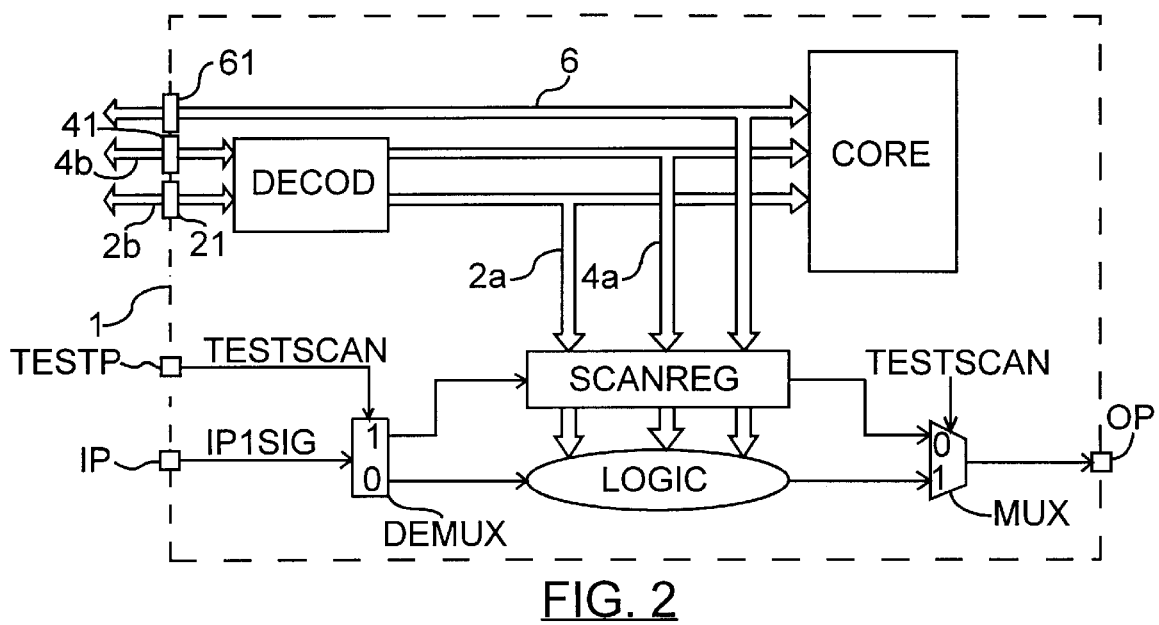

FIG. 2 illustrates a very simplified example of implementation of shift register testing according to the state of the art. A circuit 1 includes a processor CORE and a set LOGIC of logic circuits. The processor and the logic circuits are interconnected by control, address, and data buses 2a, 4a, and 6. The data bus is accessible outside the circuit by an input/output port 61. An interface circuit DECOD ensures the interface between internal control and address buses 2a and 4a and control and address buses 2b and 4b connected outside the circuit by input/output ports 21 and 41.

An internal shift register SCANREG enables the sampling of or imposing states on internal buses 2a, 4a, and 6.

The circuit also includes a primary input IP, a primary output OP, and a test control primary input TESTP which supplies a test control signal TESTSCAN. Input IP is connected via a demultiplexer DEMUX on the one hand to an input of set LOGIC, and on the other hand to the input of register SCANREG. Output OP is connected via a multiplexer MUX on the one hand to an output of set LOGIC, and on the other hand to the output of register SCANREG. Input TESTP enables control of circuits MUX and DEMUX according to whether the circuit is in normal operating mode (TESTSCAN=0) or in test mode (TESTSCAN=1), to selectively connect input IP and output OP to set LOGIC or to register SCANREG.

Figure 3:
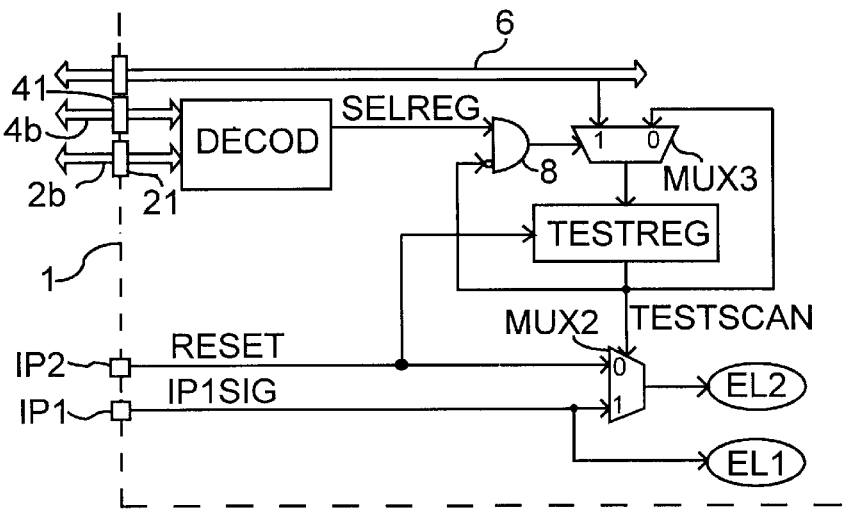
FIG. 3 illustrates the circuit such as shown in FIG. 1, modified so as to implement the present invention.

With respect to the circuit of FIG. 2, the circuit of FIG. 3 includes a programmable storage cell, internal to the circuit, for storing the operating mode (normal or test) of the circuit.

This cell is for example a flip-flop TESTREG. This flip-flop has an input connected to the data bus so that its state can be programmed from outside the circuit when a selection signal SELREG supplied by the interface circuit on bus 2a is in a given state. The state (TESTSCAN) stored in the flip-flop is supplied to the internal elements of the circuit implied in the testing, such as the multiplexing and demultiplexing circuits meant for the testing.

Register TESTREG controls a two-input multiplexer MUX2 having its inputs connected to two primary inputs IP1 and IP2 of the circuit. Inputs IP1 and IP2 are connected to one or several internal elements of circuit 1, respectively referenced as EL1 and EL2. Input IP2 is also connected to a clearing input of flip-flop TESTREG. Input IP2 will for example be a reset control input of circuit 1 which enables, in normal operating mode, to set element(s) EL2 of the circuit to a determined state by supplying thereto a reset signal RESET. Input IP1 supplies a signal referred to as IP1SIG to element(s) EL1.

In test mode, signal IP1 SIG is supplied to element(s) EL2 via multiplexer MUX2, which then insulates input IP2. This (these) element(s) are then accessible from outside the circuit. Input IP1 then substitutes for input IP2. It should be noted that input IP1 may possibly be insulated from element (s) EL1 in test mode, if this input is not used for exchanging states with a test register. In FIG. 3, in test mode, input IP1 is connected to both elements EL1 and EL2. In practice, the fact that input IP1 is used to provide, in test mode, a signal to elements of the circuit to which it is not connected in normal operating mode is hardly disturbing since the structural test includes checking whether the logic circuits operate properly, independently from knowing whether this checking is representative of a normal operation of the circuit. It must only be checked that no stuck-at-fault is present, the physical origin of the signal supplied to the circuit for detecting a stuck-at fault being of no importance whatsoever.

Input IP2 is used to control, when the circuit is in test mode, the clearing of flip-flop TESTREG so that the circuit may switch back to the normal operating mode, which enables the recovery of, from the outside, control of the circuit during or at the end of a test. In test mode, this input is temporarily dedicated to the testing.

It should be noted that primary outputs or primary inputs/outputs of circuit 1 could have been used instead of inputs IP1 and IP2. Then, multiplexer MUX3 may be replaced with a demultiplexer.

To ensure a proper fault coverage, flip-flop TESTREG is insulated, which enables imposition of or sampling of the signals present on the internal buses during the structural test. For this purpose, a two-input multiplexer MUX3, the output of which is connected to the input of flip-flop TESTREG, an input of which is connected to bus 6 and the other input of which is connected to the output of the flip-flop which supplies signal TESTSCAN is used. This multiplexer is controlled by an AND-type logic gate 8 which receives signal SELREG on an input and signal TESTSCAN on an inverting input. Thus, when in test mode, the input and the output of the flip-flop are interconnected, and the flip-flop is insulated from the interface of the circuit. In normal operating mode, the flip-flop is accessible via bus 6.

The present invention enables combination of the advantages of the structural test by means of shift registers, inexpensive in terms of time and energy dedicated to the development of the testing patterns, which enables use of housings with smaller dimensions (if the determining factor in the size of the housing is the number of connection pins used and not the size of the encapsulated semiconductor circuit). It does not reduce the fault coverage and does not require a large number of elements internal to the circuit to compensate for the fact that a primary input dedicated to the testing is not used.

Although finding a particularly advantageous application in the field of structural testing, the present invention more generally enables, for a circuit having at least two operating modes, securely controlling the operating mode of the circuit without using any pin specifically dedicated to this control.

The present invention is likely to have various alterations, modifications, and improvements which will readily occur to those skilled in the art. Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. A circuit having at least one circuit element and capable of operating according to at least a first and a second operating mode, including:

means of interface with the outside, a storage cell programmable via the interface means of the circuit, the content of the cell being representative of the operating mode of the circuit, a first input connected on the one hand to the cell to be able to modify its content in order to modify the mode, and on the other hand to the at least one element of the circuit, a second input, and multiplexing means controlled by the cell for, on the one hand, selectively connecting the at least one element to the second input when the circuit is in the first mode and to the first input in the second mode, and on the other hand, insulating the cell from the interface means when the circuit is in the first mode.

2. A circuit according to claim 1, wherein the cell is a flip-flop, an input of which is connected to a multiplexer controlled by an output of the flip-flop so that the input of the flip-flop is connected on the one hand to its output when the state of its output is representative of the first mode, and to the circuit interface when the state of its output is representative of the second mode.

3. A circuit according to one of claim 1, wherein the first mode is a structural test mode, and wherein the second mode is a normal operating mode.

4. A circuit having at least one circuit element and at least first and second operating modes, comprising:

an interface means;

a storage means coupled to the interface means and controlled to establish a state representative of one of the first and second operating modes;

a first control input means;

means coupling the first control input means to the storage means to control the contents of the storage means to determine the represented operating mode;

a second control input means; and multiplexing means controlled from said storage means operating mode and having a first state in which the second control input means is coupled to said at least one circuit element, and a second state in which the first control input means is coupled to said at least one circuit element.

5. A circuit according to claim 4 wherein said interface means includes at least one input port and a decoder means.

6. A circuit according to claim 5 wherein said storage means comprises a flip-flop means.

7. A circuit according to claim 6 wherein said means coupling the first control input means to the storage means provides a resetting of the flip-flop means.

8. A circuit according to claim 7 wherein said multiplexing means includes a first multiplexer.

9. A circuit according to claim 8 further including a second multiplexer that is controlled by the output of the flip-flop.

10. A circuit according to claim 9 wherein the input of the flip-flop is connected on the one hand to its output when the state of the output is representative of the first mode, and to the interface means when the state of its output is representative of a second mode.

11. A circuit according to claim 4 wherein the first mode is a structural test mode and wherein the second mode is a normal operating mode.

12. A circuit according to claim 4 further including a second multiplexing means for insulating the storage means from the interface means when the circuit is in the first mode.

13. A circuit according to claim 12 further including a gate coupling to the second multiplexer for the control thereof and receiving an input from the storage means.

14. A circuit according to claim 13 wherein said storage means comprises a flip-flop circuit.

15. A circuit according to claim 14 wherein the first mode is a structural test mode and wherein the second mode is a normal operating mode.

16. A system having at least one circuit element and further providing at least first and second operating modes, said system comprising:

an interface circuit;

a storage cell coupled to the interface circuit and having its content being representative of the operating mode of the circuit;

a first control terminal;

a coupling circuit for connecting the first control terminal to the storage cell to control the contents of the storage cell to determine the represented operating mode;

a second control terminal; and a multiplexer controlled from said storage cell and having a first state in which the second control terminal is coupled to said at least one circuit element, and a second state in which the first control terminal is coupled to said at least one circuit element.

17. A system according to claim 16 wherein said interface circuit includes at least one input port and a decoder circuit.

18. A system according to claim 17 wherein said storage cell comprises a flip-flop.

19. A system according to claim 18 wherein said first control terminal couples to the flip-flop for the resetting thereof.

20. A system according to claim 19 further including a second multiplexer controlled by an output of the flip-flop and for controlling the state of the flip-flop.

21. A system according to claim 20 wherein the input of the flip-flop is connected on the one hand to its output when the state of its output is representative of the first mode, and to the interface circuit when the state of its output is representative of a second mode.

22. A system according to claim 16 and further including a second multiplexer controlled by the storage cell state.

23. A system according to claim 22 further including a gate for controlling the second multiplexer and having an input coupled from the storage cell.

24. A system according to claim 16 wherein the first mode is a structural test mode and wherein the second mode is a normal operating mode.

* * * * *